United States Patent [19]
Mori et al.

[11] Patent Number: 5,668,650
[45] Date of Patent: Sep. 16, 1997

[54] THIN FILM TRANSISTOR PANEL HAVING AN EXTENDED SOURCE ELECTRODE

[75] Inventors: Hisatoshi Mori, Hachioji; Hiroyuki Okimoto, Hino, both of Japan

[73] Assignee: Casio Computer Co., Ltd., Tokyo, Japan

[21] Appl. No.: 755,200

[22] Filed: Nov. 25, 1996

Related U.S. Application Data

[63] Continuation of Ser. No. 300,050, Sep. 2, 1994, abandoned.

[30] Foreign Application Priority Data

Sep. 6, 1993 [JP] Japan ................. 5-220935

[51] Int. Cl.$^6$ .............................. G02F 1/1343
[52] U.S. Cl. .............................. 349/42; 349/139
[58] Field of Search ................. 359/54, 55, 57, 359/59, 87

[56] References Cited

U.S. PATENT DOCUMENTS 5,285,302  2/1994  Wu .............................. 359/55

Primary Examiner—Wael Fahmy
Assistant Examiner—Fetsum Abraham
Attorney, Agent, or Firm—Frishauf, Holtz, Goodman, Langer & Chick

[57] ABSTRACT

A thin film transistor panel comprises a substrate, pixel electrodes arranged on the substrate in a matrix form, TFTs each having a source electrode connected to the associated pixel electrode, gate lines and data lines, both connected to the associated TFTs. An auxiliary electrode connected to the associated gate line and a capacitance compensation electrode are provided in such a manner as to cancel a change in gate-source capacitance caused by an alignment error in the manufacturing process. The capacitance compensation electrode is shifted by the same amount as the shift of the source electrode. When the facing area between the gate electrode and source electrode increases (or decreases) due to an alignment error in the manufacturing process, the facing area between the auxiliary electrode and capacitance compensation electrode decreases (or increases). Therefore, the total gate-source capacitance or the sum of the capacitance between the facing portions of the gate electrode and source electrode and the capacitance between the facing portions of the auxiliary electrode and capacitance compensation electrode is constant regardless of a variation in the position of the source electrode.

15 Claims, 13 Drawing Sheets

THIN FILM TRANSISTOR PANEL HAVING AN EXTENDED SOURCE ELECTRODE

This application is a Continuation of U.S. application Ser. No. 08/300,050, filed Sep. 2, 1994, now abandoned.

BACKGROUND OF THE INVENTION

1. Field of the Invention

The present invention relates to a thin film transistor panel (hereinafter called "TFT panel") which is used in an active matrix liquid crystal display (LCD) device.

2. Description of the Related Art

An active matrix LCD device, which has thin film transistors (TFTs) as active elements, comprises a TFT panel having a transparent substrate, a plurality of pixel electrodes formed in a matrix form on the transparent substrate, a plurality of gate lines, a plurality of data lines and a plurality of TFTs associated with the individual pixel electrodes; an opposite panel having a transparent substrate and opposite electrodes formed on the transparent substrate and opposite to the pixel electrodes; and a liquid crystal sealed between the TFT panel and the opposite panel. In a color LCD device which provides a color image display, etc., red, green and blue color filters are provided on the opposite panel or the TFT panel in association with the individual pixel electrodes.

There are two layout patterns of the pixels in the active matrix LCD device: (1) mosaic layout pattern in which the pixels are arranged linearly in the row direction and in a zigzag form in the column direction, and (2) grid or matrix layout pattern in which the pixels are arranged linearly both in the row and column directions.

FIGS. 9 and 10 illustrate the structure of a TFT panel used in an LCD device which has pixels arranged in a mosaic pattern. FIG. 9 is a plan view of a part of the TFT panel, and FIG. 10 is an enlarged cross-sectional view taken along the line 10—10 in FIG. 9. This TFT panel is used in a color LCD device which has red, green and blue color filters provided on the opposite panel.

The illustrated TFT panel comprises a transparent substrate 1 made of glass or the like, a plurality of pixel electrodes 2 (2R, 2G, 2B) formed in a matrix form on the transparent substrate 1, a plurality of gate lines Lg, a plurality of data lines Ld provided for respective rows of the pixel electrodes 2 each row for displaying the pixels of the same color, and a plurality of TFTs 3 associated with the individual pixel electrodes 2.

The pixel electrodes 2 are formed by a transparent conductive film, such as an ITO (Indium Tin Oxide) film. The pixel electrodes 2 include pixel electrodes 2R for displaying red pixels (the electrodes facing the red color filter on the opposite panel), pixel electrodes 2G for displaying green pixels (the electrodes facing the green color filter on the opposite panel) and pixel electrodes 2B for displaying blue pixels (the electrodes facing the blue color filter on the opposite panel). The pixel electrodes 2R, 2G and 2B are alternately arranged in the row direction (horizontal direction in FIG. 9). The pixel electrodes 2 are arranged in a zigzag form in the column direction (vertical direction in FIG. 9) in such a manner that groups of the pixel electrodes which display the pixels of the same color are alternately shifted by about 1.5 pitches in the row direction.

As shown in FIG. 10, the TFT 3 comprises a gate electrode GE formed on the substrate 1, a gate insulating film 4, an i-type semiconductor film 5, an n-type semiconductor film 6, a source electrode SE and a drain electrode DE, the latter two electrodes SE and DE being electrically connected via the n-type semiconductor film 6 to the i-type semiconductor film 5.

The gate lines Lg are laid on the substrate 1 along the individual rows in the matrix of the pixel electrodes 2. The gate electrodes of the TFTs 3 in each row and the associated gate line Lg are formed integrally.

The gate insulating film 4 of the TFT 3 is formed on substantially the entire surface of the substrate 1, covering the gate line Lg. The pixel electrode 2 is formed on this gate insulating film 4.

Each gate line Lg is laid facing the edge portion of the previous or next row of the pixel electrodes 2 to the associated row of the pixel electrodes 2. A compensation capacitor for holding the potential of each pixel electrode 2 during the unselected period is constituted by the pixel electrode 2, the gate line Lg and the gate insulating film 4 therebetween.

The data line Ld is laid on a protective insulating film 7 which is formed covering each TFT 3.

The layout pattern of the data lines Ld will be discussed now with reference to the one associated with the green pixel electrodes 2G. The data line Ld runs in a zigzag form along the right-hand edges of the pixel electrodes 2G which are shifted leftward in FIG. 9 and the left-hand edges of the pixel electrodes 2G which are shifted rightward.

The zigzag layout of the data line Ld is employed to shorten its portion between rows of the pixel electrodes 2 (the line extending horizontally in the diagram).

With the data lines Ld laid out as shown in FIG. 9, the position of the data line Ld associated with the TFTs 3 connected to the pixel electrodes 2G shifted leftward is opposite to the position of the data line Ld associated with the TFTs 3 connected to the pixel electrodes 2G shifted rightward. In this TFT panel, therefore, the positional relation between the source electrodes SE and the drain electrodes DE of the TFTs 3 connected to the pixel electrodes 2G shifted leftward is set opposite to the positional relation between the source electrodes SE and the drain electrodes DE of the TFTs 3 connected to the pixel electrodes 2G shifted rightward. This design always allows the source electrode SE of each TFT 3 to be connected to the associated pixel electrode 2G and the drain electrode DE to be connected to the associated data line Ld.

The data line Ld associated with the red pixel electrodes 2R and the data line Ld associated with the blue pixel electrodes 2B are likewise laid out in the same manner as the data line Ld associated with the green pixel electrodes 2G. With regard to the TFTs 3 associated with the pixel electrodes 2R and the pixel electrodes 2B, the positional relation between the source electrodes SE and the drain electrodes DE of the TFTs 3 associated with the pixel electrodes 2 shifted leftward is set opposite to the positional relation between the source electrodes SE and the drain electrodes DE of the TFTs 3 associated with the pixel electrodes 2 shifted rightward.

Each pixel electrode 2 is connected to the source electrode SE of the associated TFT 3 at the extending portion (connecting portion) formed at the edge portion of the electrode 2. Each data line Ld is connected to the drain electrodes DE of the TFTs 3 via contact holes formed in the protective insulating film 7.

The TFT panel used in an LCD device which has pixel electrodes arranged in a grid pattern will now be described.

FIG. 11 is a plan view of a part of a conventional TFT panel used in this type of LCD device. This TFT panel is also used in a color LCD device which has the color filters provided on the opposite panel.

The pixel electrodes 2 of different colors of the TFT panel are alternately and linearly arranged in the row direction, while the pixel electrodes 2 for displaying the pixels of the same color are arranged linearly in the column direction. Each data line Ld is linearly laid out along the associated column of the pixel electrodes 2.

In this TFT panel, the positions of the TFTs 3 with respect to the pixel electrodes 2 and the associated data line Ld are the same for every pixel electrode 2. Every TFT 3 therefore has the same positional relationship between the source electrode SE and the drain electrode DE.

This TFT panel has a capacitor line Lc formed facing an associated row of the pixel electrodes 2 on the substrate 1. The compensation capacitor for holding the potential of each pixel electrode 2 is constituted by the pixel electrode 2, the capacitor line Lc and the gate insulating film 4 therebetween.

The pixel electrodes 2, a plurality of films constituting each TFT 3, the gate line Lg, the data line Ld, etc. are generally formed by photolithography. According to the photolithography, a photoresist film is formed on a layer to be patterned, this photoresist film is exposed, the exposed photoresist film is developed to form an etching mask and the layer to be patterned is etched using this etching mask, thereby yielding the desired pattern.

The exposure of the photoresist film is executed by optically reducing a mask pattern, which has enlarged shapes (pattern) of elements to be formed and is formed on an exposure mask, and projecting the mask pattern on the photoresist film.

In the case of manufacturing large TFT panels used in an LCD device with a large screen, it is difficult to perform exposure on the entire substrate at a high precision. In this respect, the production of large TFT panels employs divisional exposure to sequentially expose a plurality of areas on the substrate using a stepper.

If the divisional exposure scheme is used to manufacture the conventional TFT panels, however, the value of the gate-source capacitance of the TFT 3 differs exposure area by exposure area due to the positional misalignment at the time of exposure. Accordingly, the voltage holding characteristic of each pixel of the LCD device differs exposure area by exposure area, causing display blurring.

This problem will now be explained specifically. To begin with, the voltage holding characteristic of each pixel of the LCD device will be discussed with reference to FIG. 12, which is an equivalent circuit diagram of one pixel of the LCD device.

In FIG. 12, "Cgd" denotes a gate-drain capacitor (capacitor between the facing portions of the gate electrode and drain electrode), "Cgs" denotes a gate-source capacitor (capacitor between the facing portions of the gate electrode and source electrode), "Cs" denotes a compensation capacitor (capacitor between the facing portions of the pixel electrode and the gate line or capacitor line), and "$C_{LC}$" denotes a capacitor (pixel capacitor) constituted by the pixel electrode, the associated opposite electrode of the opposite panel and the liquid crystal therebetween.

During the selected period of a pixel, a gate pulse is applied to the gate line Lg associated with this pixel, turning on the associated TFT 3. A data signal is applied to the pixel electrode 2 via the enabled TFT 3 from the data line Ld. The voltage between the pixel electrode 2 and the opposite electrode increases along the rising curve according to the voltage-current characteristic of the TFT 3.

In the unselected period of this pixel, the gate pulse is disabled to turn off the TFT 3, causing the voltage between the pixel electrode 2 and the opposite electrode to fall by $\Delta V$ from the voltage at the end of the selected period due to the influence of the gate pulse. The decreased voltage becomes the voltage the pixel holds during the unselected period.

The voltage drop $\Delta V$ is expressed by an equation (1).

$$\Delta V = V_g \cdot C_{gs}/(C_{LC}+C_s+C_{gs}) \tag{1}$$

where Vg is the voltage of the gate pulse applied to the gate electrode of the TFT during the selected period.

A description will now be given of the point that the voltage holding characteristic of each pixel of the LCD device differs exposure area by exposure area.

Of the capacitances $C_{LC}$, Cs and Cgs which determine the voltage drop $\Delta V$, the pixel capacitance $C_{LC}$ is the same for all the pixels because every pixel electrode 2 has the same area.

The compensation capacitance Cs is determined by the facing area between the pixel electrode 2 and the gateline Lg or the capacitor line Lc.

Since the gate line Lg is straight in the TFT panel shown in FIG. 9, the area of the gate line Lg facing the pixel electrode 2 does not vary even if the gate line Lg is shifted in the lengthwise direction.

The TFT panel shown in FIG. 11 has two projections which protrude from the capacitor line Lc and face both edge portions of the pixel electrode 2. If the two projections have the same length, even when the capacitor line Lc is shifted in the lengthwise direction to reduce the facing area between one projection and the pixel electrode 2, the facing area between the other projection and the pixel electrode 2 increases accordingly. As a result, the facing area between the capacitor line Lc and the pixel electrode 2 does not vary. In both structures shown in FIGS. 9 and 11, even if the exposure position is shifted in the row direction in the matrix of the pixel electrodes 2, the compensation capacitance Cs is the same for all the pixels.

The gate-source capacitance Cgs is determined by the facing area between the gate electrode GE and the source electrode SE. This facing area changes when the position of the source electrode SE is shifted in the row direction of the pixel electrodes 2 (the lengthwise direction of the gate line Lg or the widthwise direction of the gate electrode GE).

This point will be described specifically with reference to FIGS. 13A and 13B.

FIG. 13A shows the source electrode SE and the drain electrode DE shifted leftward from the reference positions, and FIG. 13B shows the source electrode SE and the drain electrode DE shifted rightward from the reference positions.

As shown in FIG. 13A, if the source electrode SE and the drain electrode DE are formed shifted leftward from the reference positions, the facing area between the gate electrode GE and source electrode SE of the TFT 3 (the hatched area in the diagram) becomes smaller, thus reducing the gate-source capacitance Cgs. If the source electrode SE and the drain electrode DE are formed shifted rightward from the reference positions, on the other hand, the facing area between the gate electrode GE and source electrode SE becomes larger, thus increasing the gate-source capacitance Cgs.

When the TFT panel is produced using the divisional exposure, the error of the misalignment of the exposure mask differs exposure area by exposure area. Therefore, the source electrode SE is formed shifted leftward in one exposure area as shown in FIG. 13A and the source electrode SE is formed shifted rightward in another exposure area as shown in FIG. 13B. The amount of shifting also differs exposure area by exposure area. Accordingly, the gate-source capacitance Cgs of each TFT 3 differs exposure area by exposure area.

If the gate-source capacitance Cgs of each TFT 3 differs exposure area by exposure area, the change in voltage ΔV given from the equation (1) differs exposure area by exposure area. Therefore, the voltage holding characteristic of each pixel in a single LCD device differs exposure area by exposure area, causing display blurring.

If forming positions of the source electrode SE and the drain electrode DE are shifted rightward or leftward from the reference positions, the facing area between the gate electrode GE and source electrode SE changes. As a result, the gate-drain capacitance Cgd of the TFT 3 differs exposure area by exposure area. This does not however raise significant problems because the gate-drain capacitance Cgd does not affect the voltage holding characteristic of the pixel.

In the TFT panel shown in FIG. 9, the positional relation between the source electrode SE and the drain electrode DE of the TFT 3 is reversed row by row. Even in one exposure area, therefore, the gate-source capacitance Cgs differs row by row.

This point will be described with reference to FIGS. 14A and 14B.

FIGS. 14A and 14B illustrate the source electrodes SE and drain electrodes DE of the TFTs 3 in two adjoining rows of the conventional TFT panel shown in FIG. 9 shifted leftward from the reference positions. FIG. 14A shows the TFT 3 whose source electrode SE is located on the left side, and FIG. 14B shows the TFT 3 whose source electrode SE is located on the right side.

If the source electrode SE and drain electrode DE are shifted, for example, leftward as shown in FIGS. 14A and 14B, the facing area between the gate electrode GE and the source electrode SE becomes smaller in the TFT 3 in FIG. 14A, reducing the gate-source capacitance Cgs. In the TFT 3 in FIG. 14B, the facing area between the gate electrode GE and the source electrode SE becomes larger, increasing the gate-source capacitance Cgs.

If the source electrode SE and drain electrode DE are shifted rightward, the facing area between the gate electrode GE and the source electrode SE for the TFT 3 of the type shown in FIG. 14A becomes larger, increasing the gate-source capacitance Cgs, while the facing area between the gate electrode GE and the source electrode SE for the TFT 3 of the type shown in FIG. 14B becomes smaller, decreasing the gate-source capacitance Cgs.

When the gate-source capacitance Cgs of the TFT 3 differs row by row, the value of ΔV obtained from the equation (1) varies row by row. In the LCD device which uses the TFT panel shown in FIG. 9, the voltage holding characteristic of each pixel varies exposure area by exposure area, and varies row by row even in a single exposure area. When the same data signal is supplied to the individual pixels, the voltage held by each pixel varies exposure area by exposure area and row by row, causing display blurring.

SUMMARY OF THE INVENTION

It is therefore a primary object of the present invention to provide a TFT panel whose thin film transistors all have the same gate-source capacitance, thereby contributing to providing an LCD device which has an excellent display quality without display blurring.

It is another object of this invention to provide a TFT panel whose thin film transistors all have the same gate-source capacitance even when fabricated using partial exposure.

To achieve the above objects, a TFT panel according to one aspect of this invention comprises:

a substrate;

a plurality of pixel electrodes arranged on the substrate in rows and columns in a matrix form;

a plurality of gate lines provided in association with individual rows of the matrix of the pixel electrodes and each extending in a row direction;

a plurality of data lines provided in association with individual columns of the matrix of the pixel electrodes and each extending in a column direction;

a plurality of thin film transistors arranged in association with the pixel electrodes, each thin film transistor having a gate electrode formed integrally at one side of an associated one of the gate lines and protruding therefrom, a gate insulating film covering the gate electrode, a semiconductor film formed, facing the gate electrode, on the gate insulating film, a first electrode connected to the semiconductor film and the associated pixel electrode, and a second electrode connected to the semiconductor film and an associated one of the data lines, each gate line having an extending auxiliary electrode formed for each thin film transistor; and a third electrode provided for each of the pixel electrodes, connected to an associated pixel electrode and facing the auxiliary electrode via an insulating film.

In the TFT panel with the above structure, the capacitance between the gate electrode and the first electrode of each thin film transistor is the sum of the capacitance between the facing portions between the gate electrode and the first electrode and the capacitance between the facing portions between the auxiliary electrode and the third electrode.

If the first and third electrodes are formed in the same step, when the forming positions of those electrodes are shifted in the lengthwise direction of the gate line from the reference positions, the facing area between the gate electrode and the first electrode increases or decreases, and the facing area between the auxiliary electrode and the third electrode decreases or increases. Therefore, the sum of the capacitance between the facing portions of the gate electrode and first electrode and the capacitance between the facing portions of the auxiliary electrode and third electrode becomes constant regardless of a variation originated from the shifting of the forming positions of those electrodes. If this TFT panel is used in an LCD device, therefore, the voltage holding characteristic of each pixel can be set almost constant.

To achieve the above objects, a TFT panel according to another aspect of this invention comprises:

a substrate;

a plurality of pixel electrodes arranged on the substrate in rows and columns in a matrix form;

a plurality of gate lines provided in association with individual rows of the matrix of the pixel electrodes and each extending in a row direction;

a plurality of data lines provided in association with individual columns of the matrix of the pixel electrodes and each extending in a column direction; and a plurality of thin film transistors arranged in association with the pixel electrodes, each thin film transistor having a gate electrode connected to an associated one of the gate lines, a first electrode connected to the associated pixel electrode, a second electrode connected to an associated one of the data lines, a first capacitor formed between the gate electrode and the first electrode, and capacitor forming means for forming a second capacitor having a capacitance which cancels out a variation in a capacitance of the first capacitor, a sum of the capacitance of the first capacitor and the capacitance of the second capacitor being kept constant regardless of a variation in a fabrication process.

The use of this TFT panel in an LCD device can allow the voltage holding characteristic of each pixel to be almost constant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A first embodiment of the present invention will now be described referring to FIGS. 1 through 6.

Figure 9:
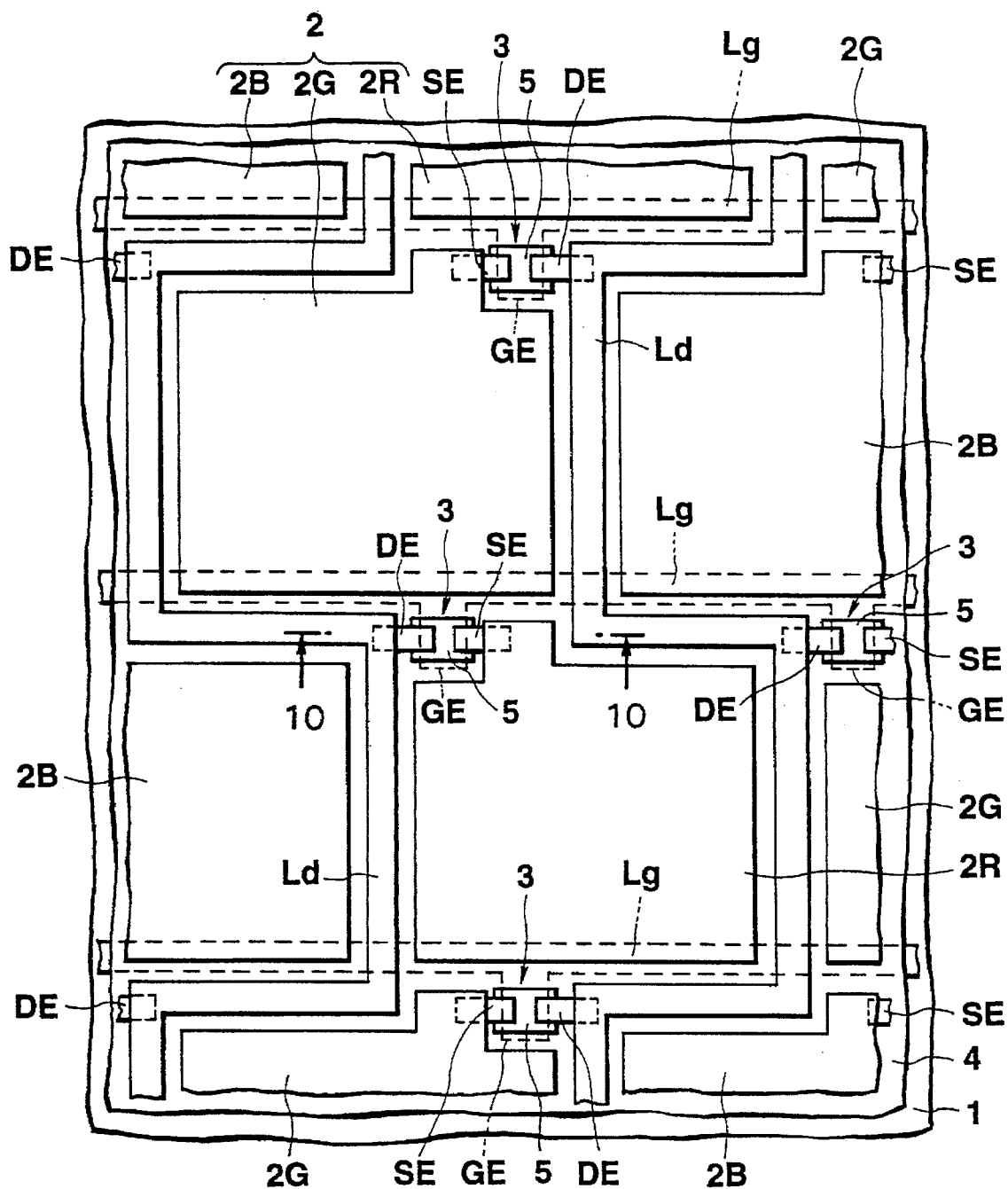
FIG. 9 is a plan view of a part of a conventional TFT panel.
Figure 10:
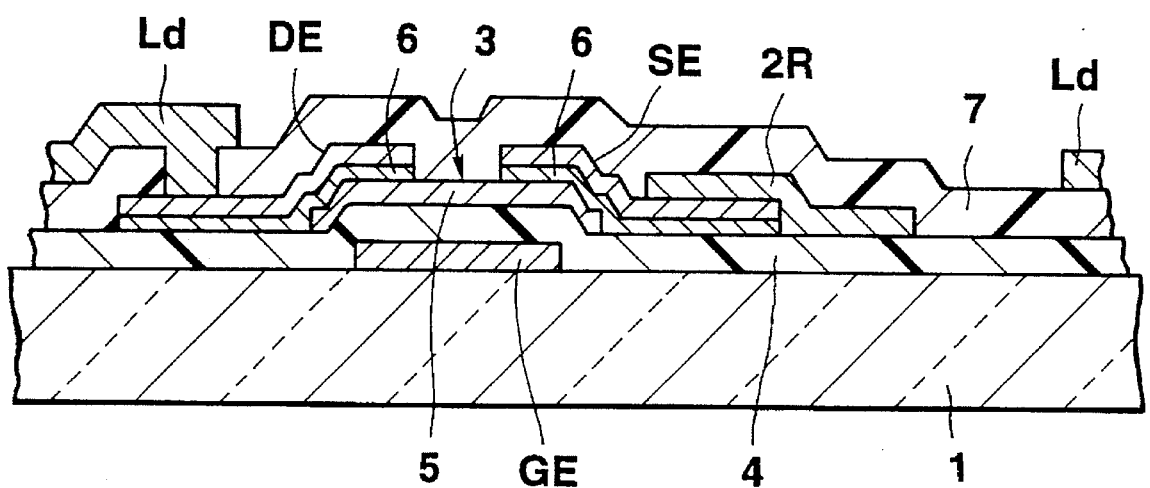
FIG. 10 is an enlarged cross-sectional view taken along the line 10—10 in FIG. 9.

A TFT panel according to this embodiment is used in a liquid crystal display device of a type which displays pixels in a mosaic pattern. Same reference numerals as used for the conventional TFT panel shown in FIGS. 9 and 10 are also used for corresponding portions in this embodiment.

Figure 1:
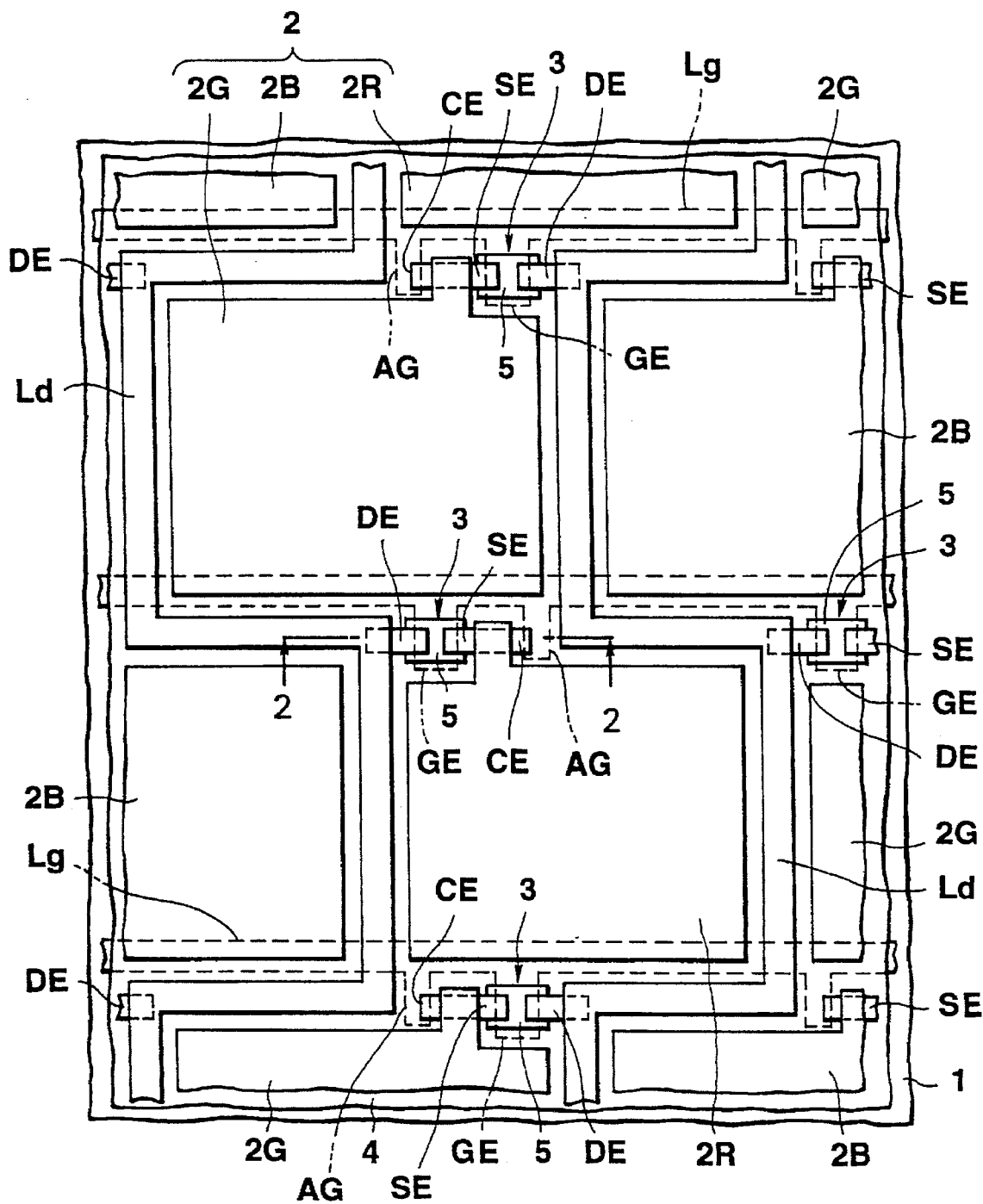
FIG. 1 is a plan view of a part of a TFT panel according to a first embodiment of the present invention.
Figure 2:
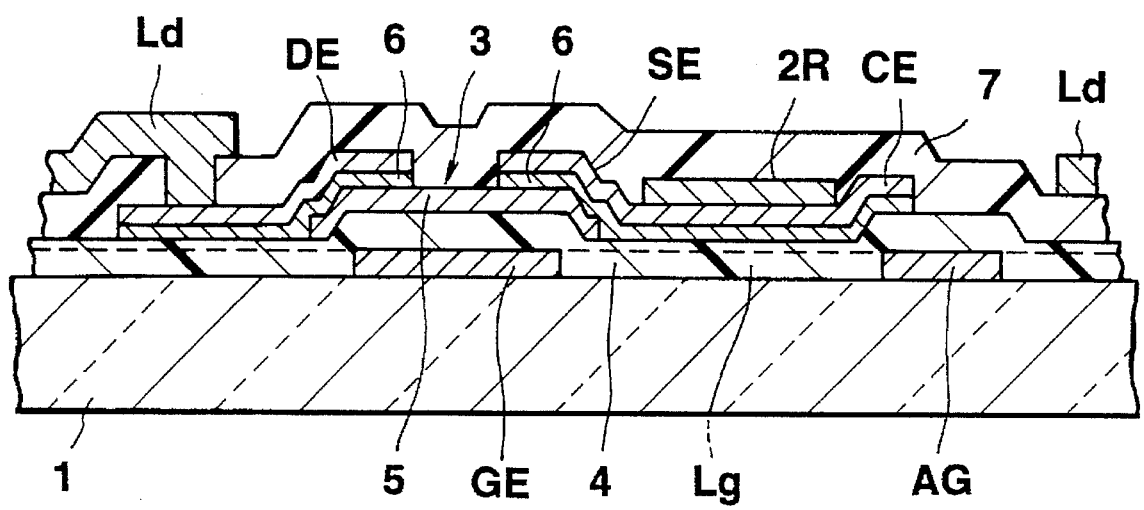
FIG. 2 is an enlarged cross-sectional view taken along the line 2—2 in FIG. 1.
Figure 4:
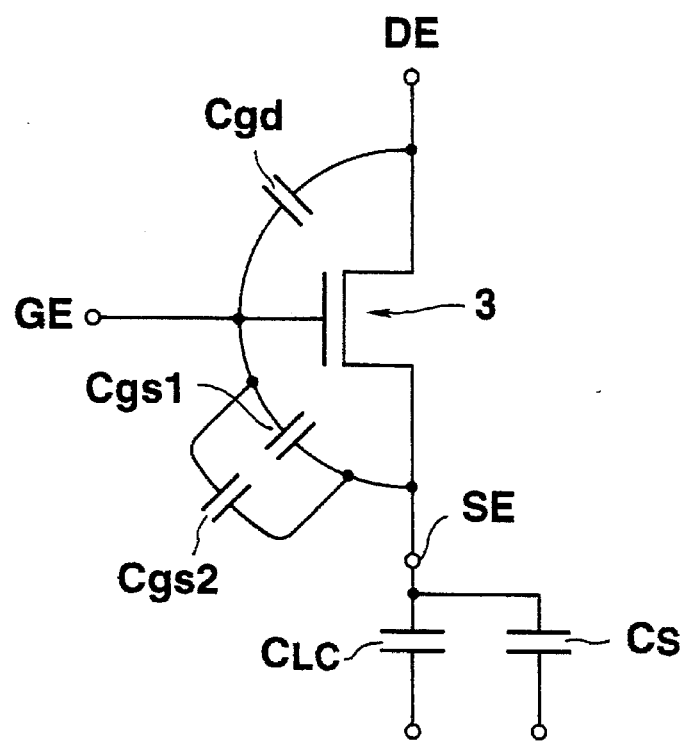
FIG. 4 is a diagram showing an equivalent circuit of one pixel of a liquid crystal display employing the TFT panel of the first embodiment.
Figure 3:
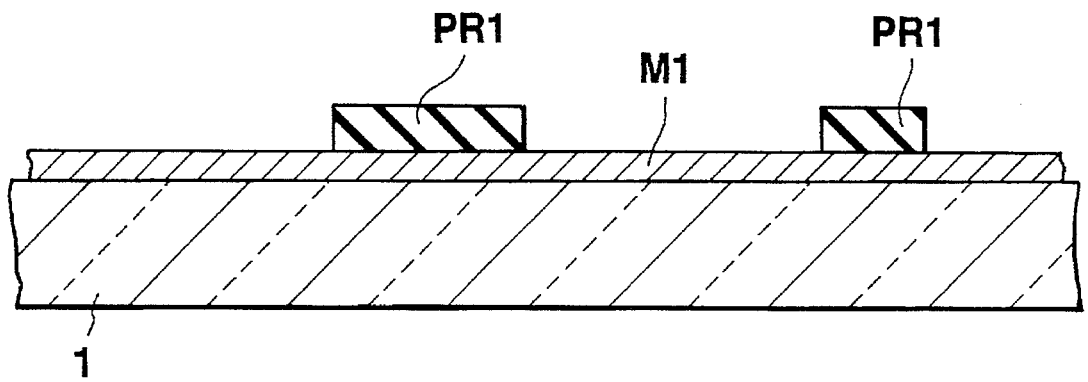
FIGS. 3A and 3B are cross-sectional views for explaining a manufacturing process of the TFT panel shown in FIGS. 1 and 2.
Figure 3:
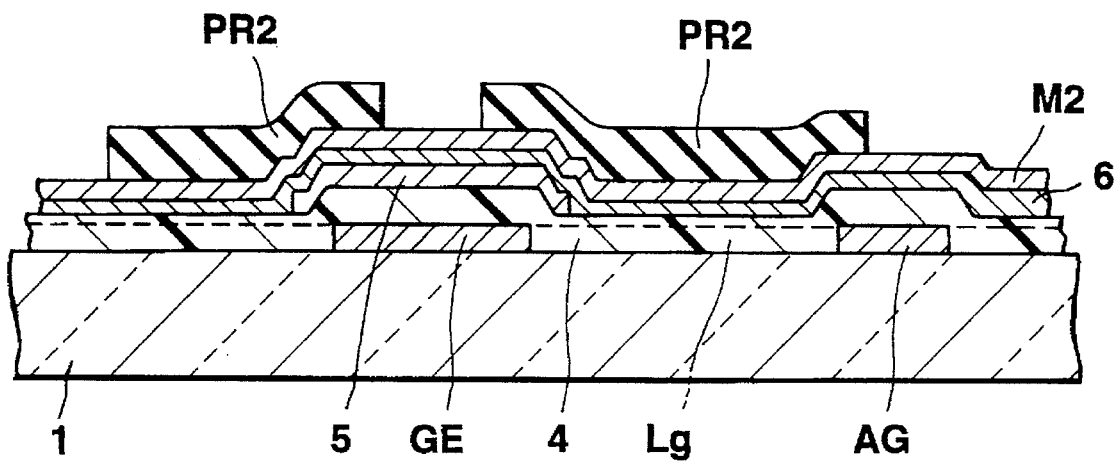
Figure 5:
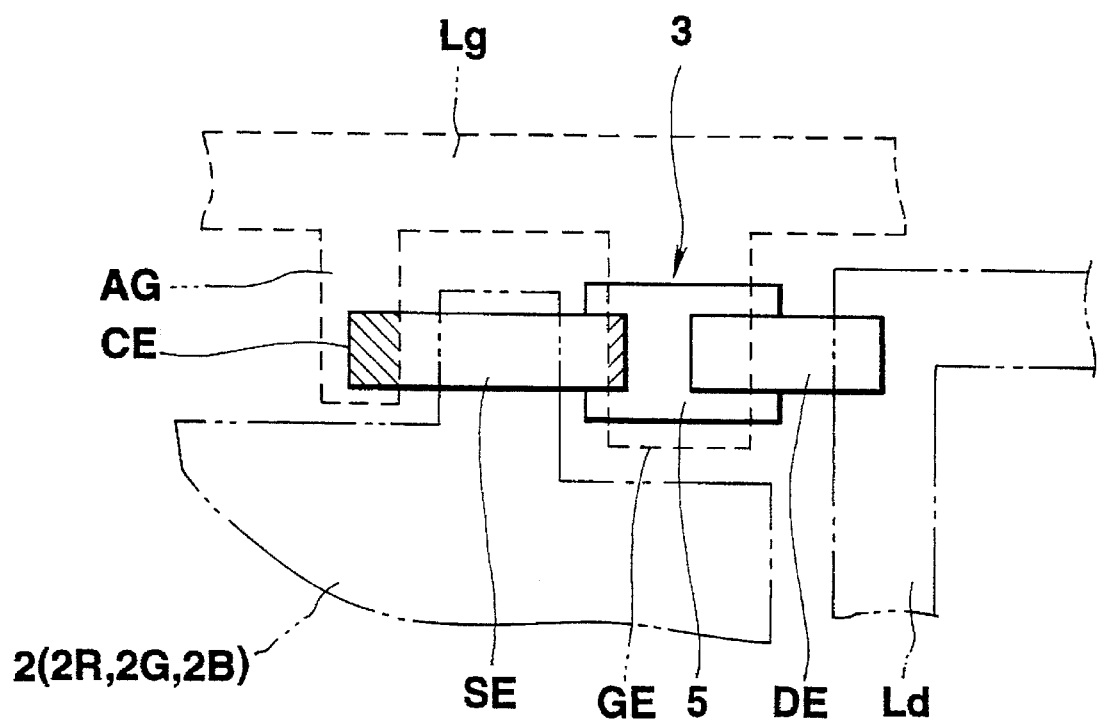
FIGS. 5A and 5B are diagrams showing that the source electrodes and drain electrodes of thin film transistors in two exposure areas are shifted when the TFT panel of the first embodiment is manufactured using a divisional exposure scheme.
Figure 5:
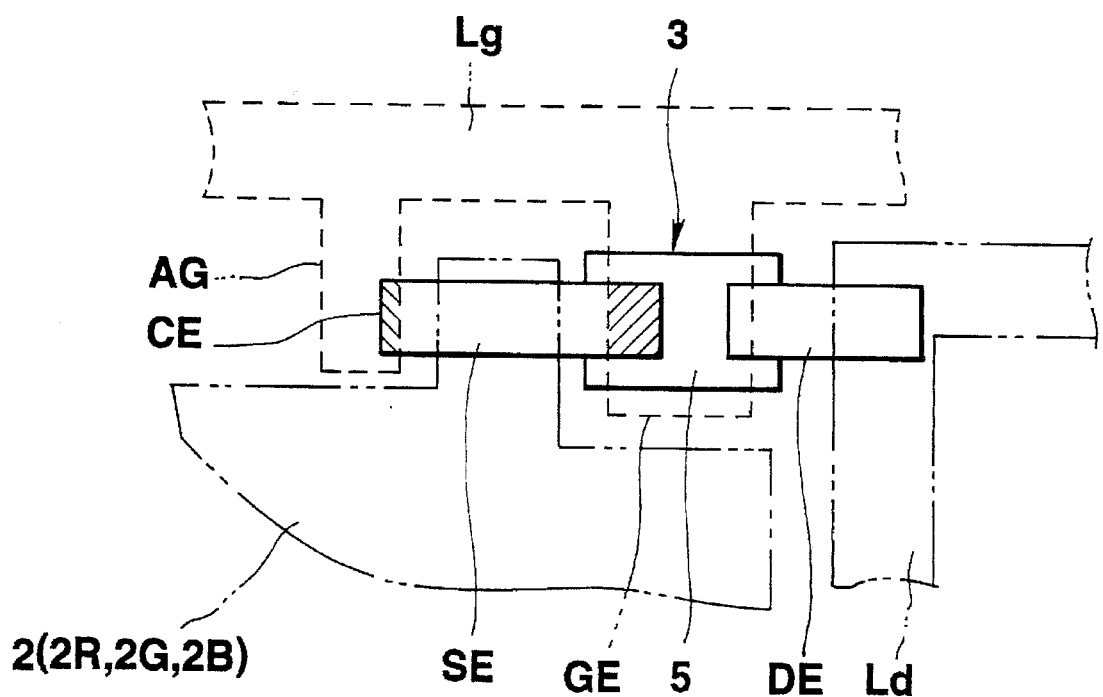

FIG. 1 is a plan view of a part of the TFT panel of the first embodiment, and FIG. 2 is an enlarged cross-sectional view taken along the line 2—2 in FIG. 1.

As shown in FIGS. 1 and 2, this TFT panel is characterized in that (1) for each gate line Lg, a gate electrode GE and an auxiliary electrode AG are formed integrally and (2) a capacitance compensation electrode CE is formed which faces the auxiliary electrode AG on the side of a TFT (Thin Film Transistor) 3 via an insulating film 4 and is connected to each source electrode SE.

The auxiliary electrode AG is provided for each TFT 3, and is provided on the side of the gate electrode GE (source-electrode side in this embodiment) which is connected to the pixel electrode 2 (2R, 2G, 2B) of the TFT 3. The auxiliary electrode AG extends in parallel to the gate electrode GE and protrudes from the gate line Lg in the same direction. The capacitance compensation electrode CE is formed integral with the source electrode SE of the TFT 3. That is, the capacitance compensation electrode CE is formed by a part extending from the source electrode SE.

The other structure is the same as that of the conventional TFT panel shown in FIGS. 9 and 10. In other words, pixel electrodes in the column direction are arranged in columns in a zigzag manner with regard to pixel electrodes in adjacent columns with a pitch of ½ of the width of the pixel electrodes.

The TFT panel with the above structure is manufactured in the following process.

First, a metal film M1 of aluminum or the like is formed on a transparent substrate 1 of glass or the like, as shown in FIG. 3A. A photoresist film PR1 is deposited on the metal film M1. Next, the photoresist film PR1 is exposed using an exposure mask which has an enlarged pattern of the gate line Lg, gate electrode GE and auxiliary electrode AG. Then, the photoresist film PR1 is developed as shown in FIG. 3A. With the developed photoresist film PR1 used as a mask, the metal film M1 is etched (patterned), forming the gate line Lg, gate electrode GE and auxiliary electrode AG. Then, the photoresist film PR1 is removed.

Next, a gate insulating film 4 of SiN or the like is formed on the entire surface of the transparent substrate 1 (including the top of the metal film M1), and a semiconductor film 5 of an i-(intrinsic) type such as a (amorphous)-Si (silicon) is deposited on this gate insulating film 4. The resultant structure is patterned in a device form.

An n-type semiconductor layer (ohmic contact layer) 6 of a-Si containing an impurity and a metal film M2 of aluminum or the like are sequentially deposited on the resultant structure as shown in FIG. 3B. Next, a photoresist film PR2 is deposited on the metal film M2. Then, the photoresist film PR2 is exposed using an exposure mask which has an enlarged pattern of the drain electrode DE, source electrode SE and capacitance compensation electrode CE. Then, the photoresist film PR2 is developed as shown in FIG. 3B. With the developed photoresist film PR2 used as a mask, the n-type semiconductor layer 6 and the metal film M2 are etched (patterned), forming the drain electrode DE connected to the i-type semiconductor layer 5, the source electrode SE connected to the i-type semiconductor layer 5 and the capacitance compensation electrode CE, which is formed integral with the source electrode SE and faces one edge portion of the auxiliary electrode AG via the insulating film 4.

A transparent conductive film of ITO (Indium Tin Oxide) is deposited on the entire surface of the substrate and the resultant structure is then patterned to form the pixel electrodes 2 (2R, 2G, 2B). Each pixel electrode 2 contacts the source electrode SE and capacitance compensation electrode CE at the protruding portion (connecting portion).

An insulating film 7 is deposited on the entire surface of the substrate, and a contact hole is formed in that portion of the insulating film 7 which lies above the drain electrode DE.

Next, the contact hole is buried to form a metal film on the insulating film 7, and this metal film is then patterned to form the data line Ld With this structure, the gate-source capacitance of each TFT 3 is the sum of the capacitance Cgs1 between the facing portions of the gate electrode GE and source electrode SE (hereinafter referred to as "main capacitance") and the capacitance Cgs2 between the facing portions of the auxiliary electrode AG and capacitance compensation electrode CE (hereinafter referred to as "sub capacitance").

If the forming positions of the source electrode SE and drain electrode DE of each TFT 3 are shifted from the reference positions in the lengthwise direction of the gate line Lg (in the widthwise direction of the gate electrode GE), the facing area between the gate electrode GE and the source electrode SE changes. If the source electrode SE is shifted in the direction to make the facing area between the electrode SE and the gate electrode GE smaller, the facing area between the auxiliary electrode AG and capacitance compensation electrode CE increases. If the source electrode SE is shifted in the direction to make the facing area between the electrode SE and the gate electrode GE larger, the facing area between the auxiliary electrode AG and capacitance compensation electrode CE decreases.

As the source electrode and capacitance compensation electrode are formed by the photolithography process using a single mask, the amounts of shifting of the source electrode and capacitance compensation electrode are equal to each other. Further, as the gate electrode GE and auxiliary electrode AG are formed using a single exposure mask, the distance between those electrodes GE and AG is constant. Therefore, the amount of an increase (decrease) in the facing area between the source electrode SE and gate electrode GE is almost equal to the amount of a decrease (increase) in the facing area between the auxiliary electrode AG and capacitance compensation electrode CE, and the absolute value of a change in main capacitance Cgs1 between the facing areas of the gate electrode GE and the source electrode SE is equal to the absolute value of a change in sub capacitance Cgs2 between the facing areas of the auxiliary electrode AG and capacitance compensation electrode CE. Therefore, the gate-source capacitance (Cgs1+Cgs2), the sum of the main capacitance Cgs1 and the sub capacitance Cgs2, is always constant regardless of the positional shifting of the source electrode SE.

The above will be explained specifically with reference to FIGS. 5A and 5B.

FIGS. 5A and 5B exemplify the shifting of the source electrodes SE and drain electrodes DE of the TFTs 3 in two exposure areas when the TFT panel of the first embodiment is manufactured using a divisional exposure scheme. FIG. 5A shows the TFT 3 formed in one exposure area and FIG. 5B shows the TFT 3 formed in the other exposure area.

In the exposure area in FIG. 5A, the source electrode SE and drain electrode DE are formed shifted leftward in the diagram and in the exposure area in FIG. 5B, the source electrode SE and drain electrode DE are formed shifted rightward in the diagram. In the TFT 3 in FIG. 5A, the facing area between the gate electrode GE and source electrode SE (the rightward and upward hatched area in the diagram) becomes smaller, reducing the main capacitance Cgs1, while in the TFT 3 in FIG. 5B, the facing area between the gate electrode GE and source electrode SE becomes larger, increasing the main capacitance Cgs1. On the other hand, the facing area between the auxiliary electrode AG and capacitance compensation electrode CE (the rightward and downward hatched area in the diagram) in the TFT 3 in FIG. 5A becomes larger, increasing the sub capacitance Cgs2, while the facing area between the auxiliary electrode AG and capacitance compensation electrode CE becomes in the TFT 3 in FIG. 5B smaller, decreasing the sub capacitance Cgs2.

Even if the source electrodes SE and drain electrodes DE of the TFTs 3 are formed shifted by different amounts from the reference positions exposure area by exposure area, the gate-source capacitance or the sum (Cgs1+Cgs2) of the main capacitance Cgs1 and the sub capacitance Cgs2 is the same for any area. Therefore, the voltage holding characteristic of each pixel of the LCD device is the same in every area, so that the LCD device does not have display blurring.

In other words, for the LCD device which uses the TFT panel of this embodiment, the voltage drop ΔV given in the equation (1) is expressed by an equation (2) in which Cgs in the equation (1) is replaced with (Cgs1+Cgs2), the sum of the main capacitance Cgs1 and the sub capacitance Cgs2.

$$\Delta V = Vg \cdot (Cgs1+Cgs2)/\{(C_{LC}+Cs+(Cgs1+Cgs2))\} \quad (2)$$

As mentioned earlier, the values of $C_{LC}$ and Cs are always constant regardless of the positional shifting of the source electrode SE and drain electrode DE. Further, the value of (Cgs1+Cgs2) is always constant regardless of the positional shifting of the source electrode SE and drain electrode DE. Therefore, ΔV is constant irrespective of the alignment error (variation in fabricated position) in the exposure step in the manufacturing process. This allows the individual pixels to have the same voltage holding characteristic. In the LCD device which uses this TFT panel, therefore, the voltage held by each pixel with respect to the same data signal supplied from the data line Ld is the same in every exposure area. It is thus possible to provide an excellent display without blurring.

The gate-drain capacitance Cgd changes according to the positional shifting of the drain electrode DE. Since the gate-drain capacitance Cgd does not affect the voltage holding characteristic of the pixels, however, no problems arise even this gate-drain capacitance Cgd varies.

In the TFT panel shown in FIG. 9, the positional relation between the source electrodes SE and the drain electrodes DE of the TFTs 3 in each row is reversed row by row. Even in one exposure area, therefore, the gate-source capacitance Cgs differs row by row when the forming positions of the source electrodes SE are shifted along the gate line Lg, as has already been explained in the description of the prior art. However, the TFT panel of the first embodiment does not have such a problem.

This point will now be explained with reference to FIGS. 6A and 6B.

Figure 6A:
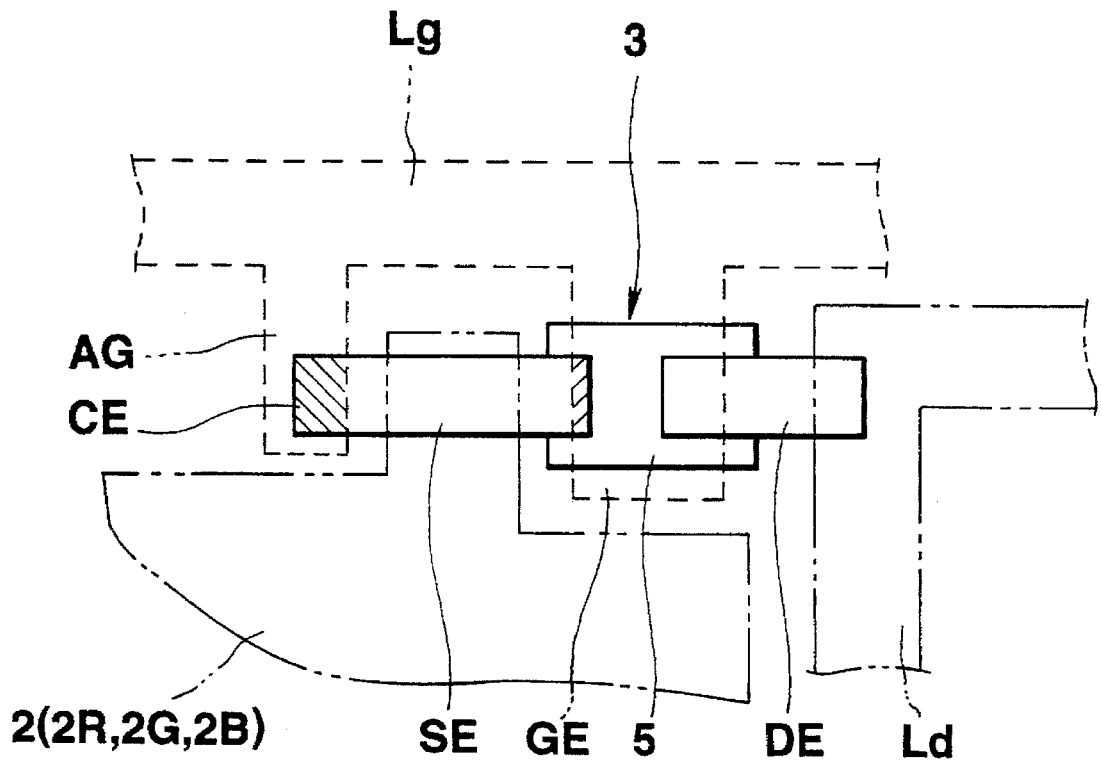
FIGS. 6A and 6B are diagrams illustrating that the source electrodes and drain electrodes of the thin film transistors in two adjoining rows of the TFT panel of the first embodiment are shifted.
Figure 6B:
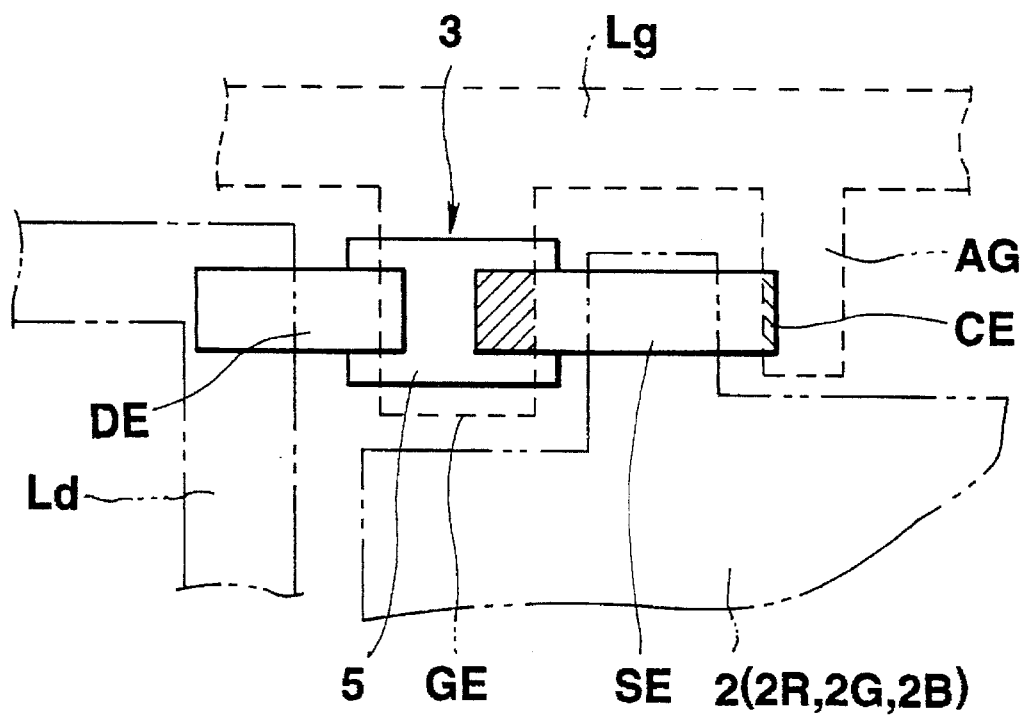

FIGS. 6A and 6B illustrate that the source electrodes and drain electrodes of the TFTs 3 in two adjoining rows of the TFT panel in FIG. 1 are shifted leftward from the reference positions.

In the TFT 3 whose source electrode SE is located on the left side, as shown in FIG. 6A, if the source electrode SE is shifted leftward from the reference position, the facing area between the gate electrode GE and source electrode SE becomes smaller, thus reducing the main capacitance Cgs1. The facing area between the auxiliary electrode AG and capacitance compensation electrode CE however becomes larger, increasing the sub capacitance Cgs2.

In the TFT 3 whose source electrode SE is located on the right side, as shown in FIG. 6B, if the source electrode SE is shifted leftward from the reference position, the facing area between the gate electrode GE and source electrode SE becomes larger, thus increasing the main capacitance Cgs1. The facing area between the auxiliary electrode AG and capacitance compensation electrode CE however becomes smaller, decreasing the sub capacitance Cgs2.

The absolute value of a change in main capacitance Cgs1 is equal to the absolute value of a change in sub capacitance Cgs2. The gate-source capacitance, which is the sum of the main capacitance Cgs1 and the sub capacitance Cgs2, is always constant regardless of the positional shifting of the source electrodes.

According to this embodiment as described above, if the forming positions of the source electrodes SE and drain electrodes DE are shifted in the widthwise direction of the gate electrodes GE in the TFT panel in which the positional relationship between the source electrodes SE and drain electrodes DE of the TFTs 3 is reversed row by row, the TFTs 3 in all the rows have the equal gate-source capacitance.

Therefore, the LCD device which uses the above TFT panel can provide an excellent display without blurring.

Second Embodiment

Figure 7:
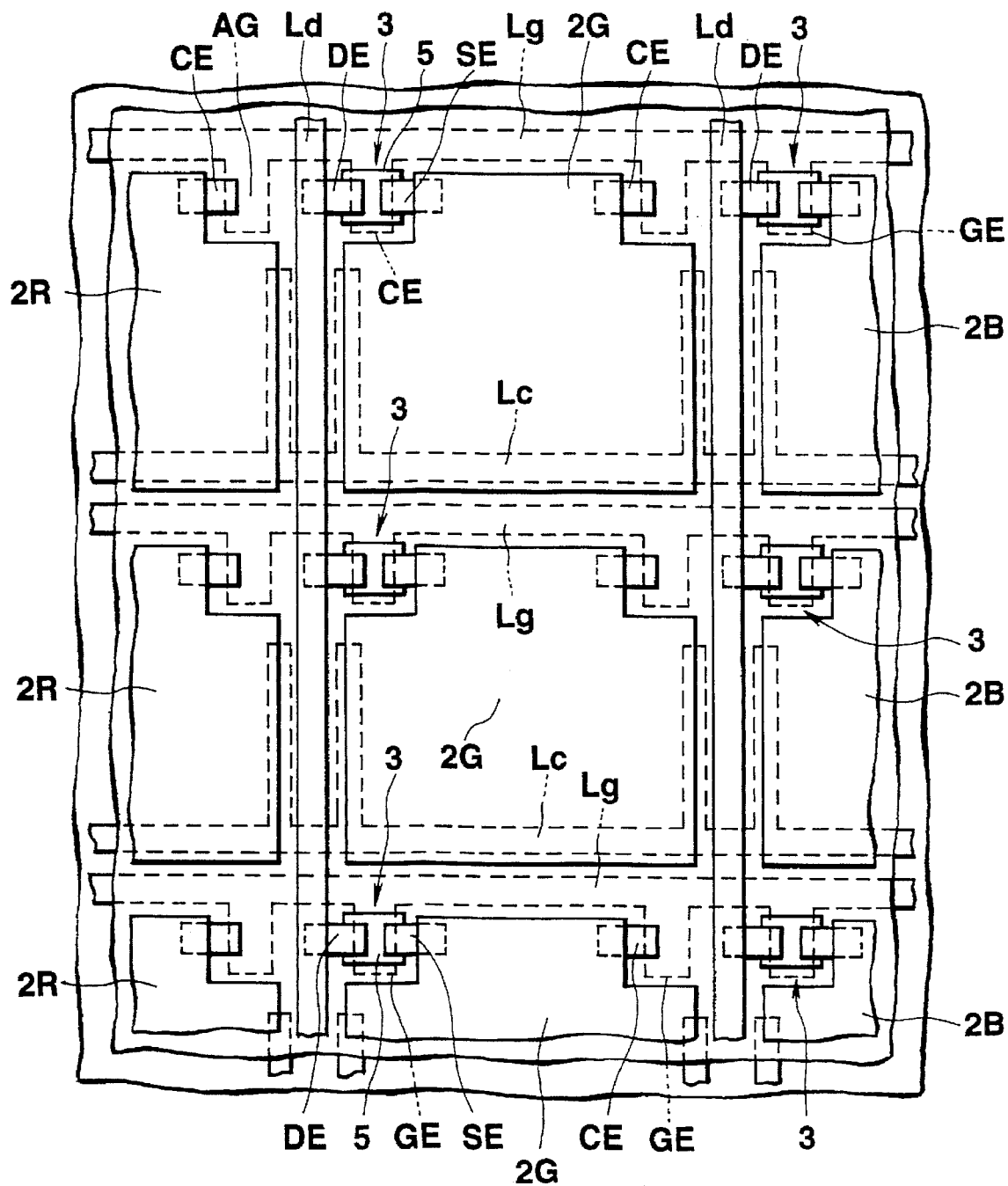
FIG. 7 is a plan view of a part of a TFT panel according to a second embodiment of the present invention.
Figure 11:
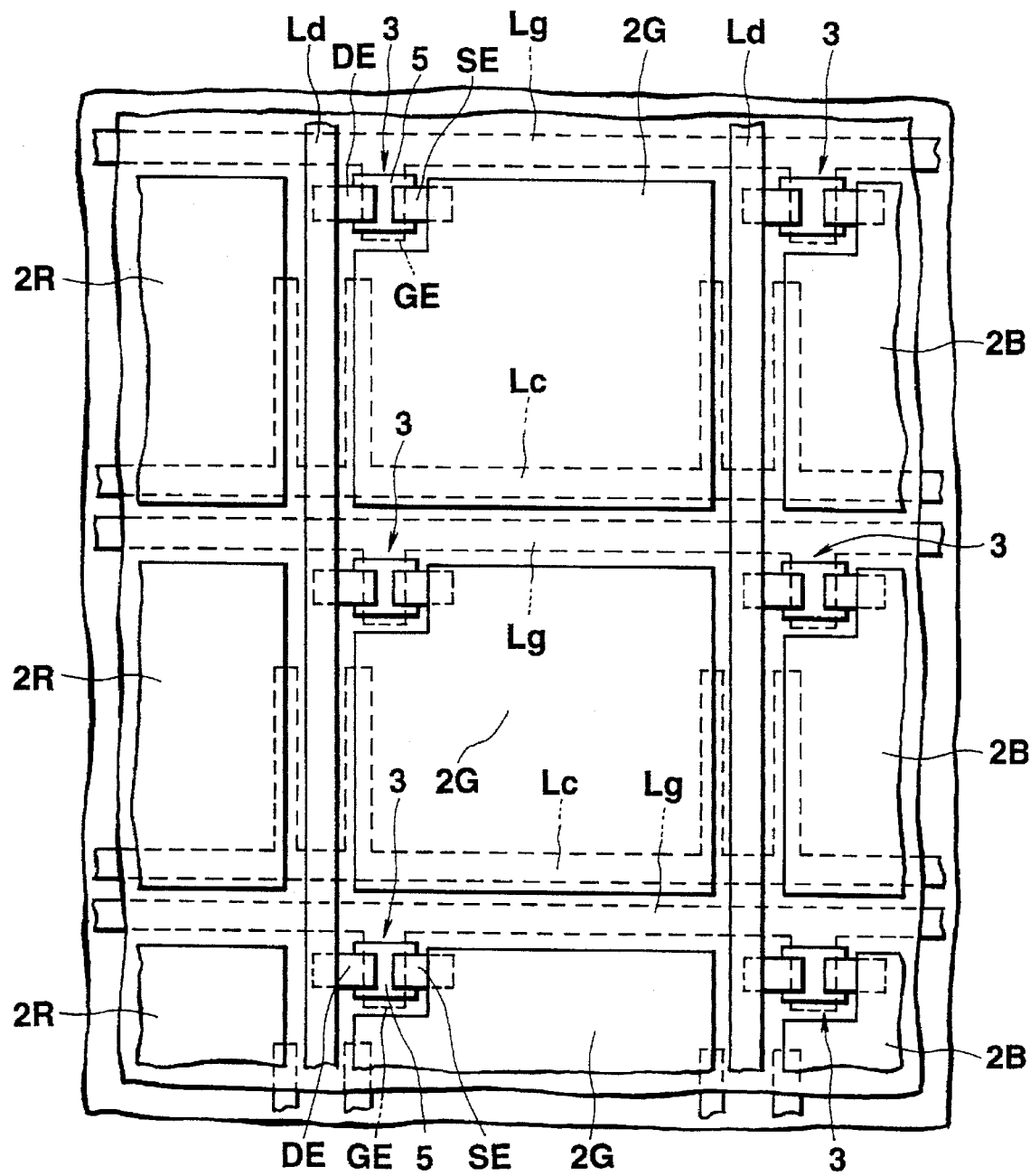
FIG. 11 is a plan view of a part of another example of the conventional TFT panel.
Figure 12:
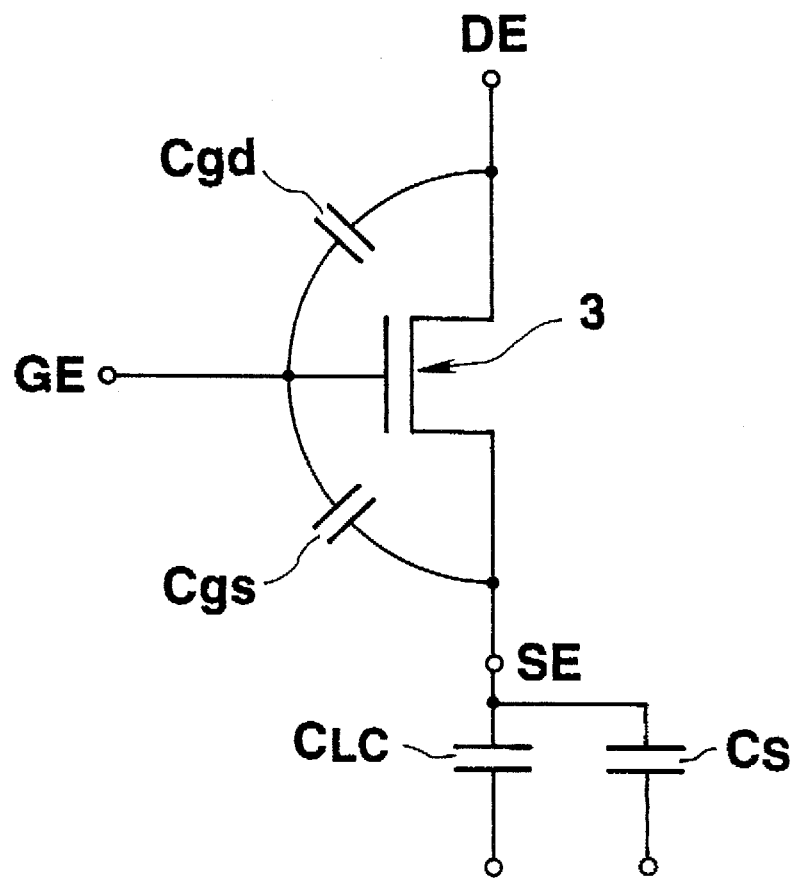
FIG. 12 is a diagram showing an equivalent circuit of one pixel of a liquid crystal display employing the conventional TFT panel.
Figure 13A:
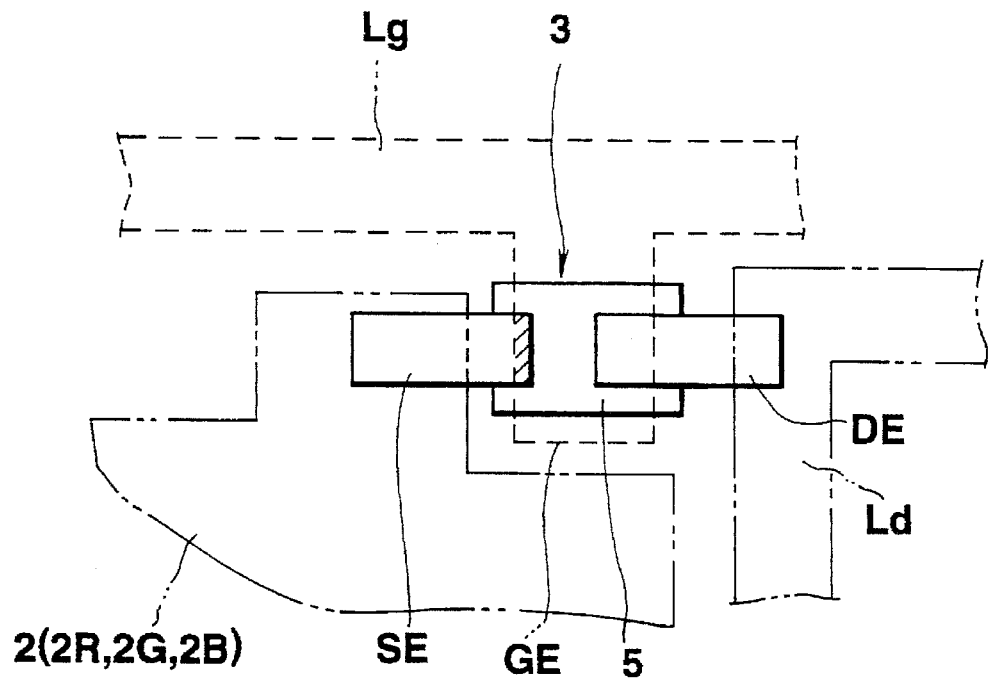
FIGS. 13A and 13B are diagrams showing that the source electrodes and drain electrodes of thin film transistors in two exposure areas are shifted when the TFT panel shown in FIG. 9 is manufactured using a divisional exposure scheme.
Figure 13B:
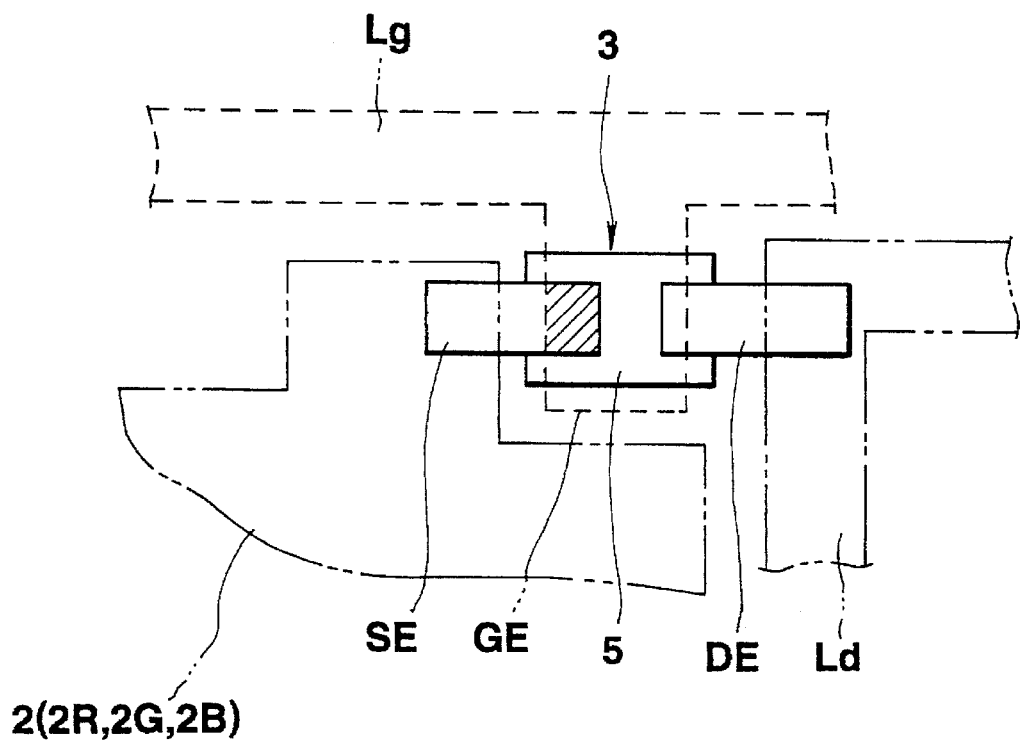
Figure 14A:
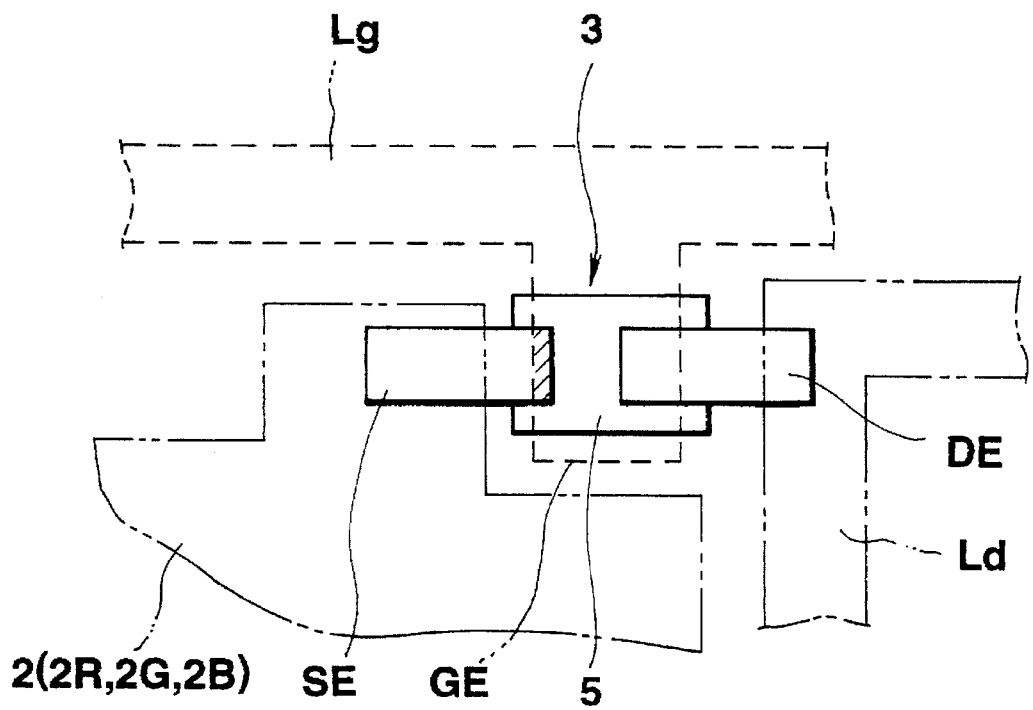
FIGS. 14A and 14B are diagrams illustrating that the source electrodes and drain electrodes of the thin film transistor panels in two adjoining rows of the conventional TFT panel shown in FIG. 9 are shifted.
Figure 14B:
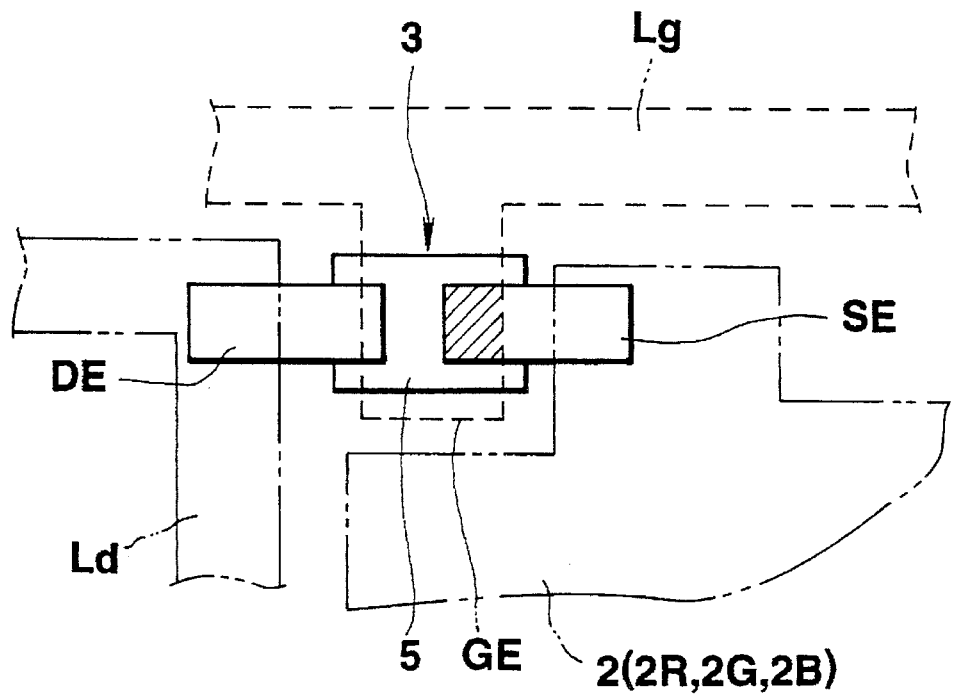

FIG. 7 is a plan view of a part of a TFT panel according to a second embodiment of the present invention. This TFT panel is used in an LCD device of a type which displays pixels in a grid pattern. Same reference numerals as used for the conventional TFT panel shown in FIG. 11 are also used for corresponding portions in this embodiment.

Like the TFT panel of the first embodiment, this TFT panel is characterized in that (1) the auxiliary electrodes AG protruding in parallel to the gate electrodes GE and in the same direction are formed on the source electrode sides of the gate electrodes GE of the gate line Lg and (2) a capacitance compensation electrode CE is formed which faces the auxiliary electrode AG on the side of the TFT 3 via the insulating film 4 and is connected to each pixel electrode 2. This embodiment differs from the first embodiment in that the capacitance compensation electrode CE is a separate electrode from the source electrode SE of the TFT 3 and the capacitance compensation electrode CE and source electrode SE are connected to the pixel electrode 2 (2R, 2G, 2B). The width of the source electrode SE is equal to the width of the capacitance compensation electrode CE.

The gate line Lg, the gate electrode GE and the auxiliary electrode AG are formed by the same process using photolithography, and the capacitance compensation electrode CE, the source electrode SE and the drain electrode DE are formed by the same process using photolithography.

In the TFT panel of this embodiment too, if the forming positions of the source electrodes SE are shifted from the reference positions in the lengthwise direction of the gate line Lg, the facing area between the gate electrode GE and source electrode SE changes. When the facing area between the source electrode SE and gate electrode GE becomes smaller, the facing area between the auxiliary electrode AG and capacitance compensation electrode CE becomes larger. When the facing area between the source electrode SE and gate electrode GE becomes larger, on the other hand, the facing area between the auxiliary electrode AG and capacitance compensation electrode CE becomes smaller. Therefore, the gate-source capacitance (Cgs1+Cgs2), which is the sum of the capacitance between the facing portions of the gate electrode GE and source electrode SE (main capacitance Cgs1) and the capacitance between the facing portions of the auxiliary electrode AG and capacitance compensation electrode CE (sub capacitance Cgs2), is always constant.

Even when the TFT panel of this embodiment is manufactured by divisional exposure using a stepper or the like, therefore, the gate-source capacitance Cgs of the TFT 3 does not vary exposure area by exposure area. It is thus possible to provide an LCD device which has an excellent display quality without blurring.

The present invention is not limited to the above-described embodiments, and any electrode structure and electrode layout may be employed as long as a variation in main capacitance Cgs1 and a change in sub capacitance Cgs2 caused by the positional misalignment at the time of exposure cancel out each other.

Figure 8:
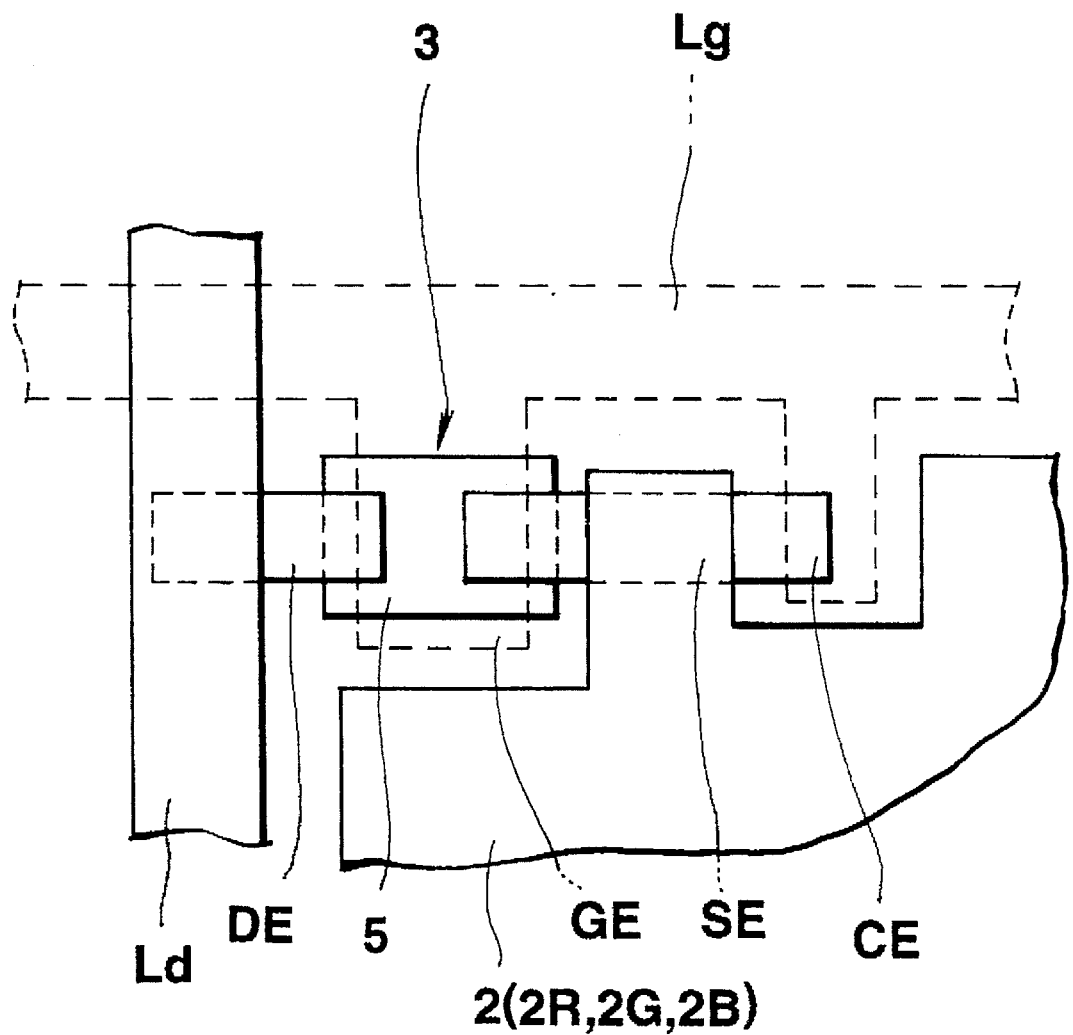
FIG. 8 is a plan view showing a modification of the TFT panel according to the second embodiment.

For example, the source electrode SE and the capacitance compensation electrode CE in the structure in FIG. 1 may be separated from each other. Further, the source electrode SE and the capacitance compensation electrode CE in the structure in FIG. 7 may be formed integral with each other. Furthermore, the gate electrode GE and auxiliary electrode AG in the structure in FIG. 7 may be arranged close to each other, while the source electrode SE and the capacitance compensation electrode CE may be connected as shown in FIG. 8.

Although the first and second embodiments have been described with reference to the case where the forming positions of the source electrode SE and drain electrode DE vary due to an error in the exposure position, the total gate-source capacitance does not change in those embodiments even if the forming position of the gate electrode GE varies due to the misalignment. That is, when the forming position of the gate electrode GE is shifted from the reference position, the position of the auxiliary electrode AG is also shifted by the same amount so that the total gate-source capacitance does not change as in the case where the forming positions of the source electrode SE and drain electrode DE are shifted from the reference positions.

According to this invention, it is possible to set a variation in gate-source capacitance for TFT panels to substantially zero.

Although the TFT panels of the first and second embodiments are used in a color LCD device which has the color filters provided at the opposite panel, the color filters may be provided above the transparent substrate 1 of the TFT panel in association with the pixel electrodes 2R, 2G and 2B. Further, the present invention may be applied to a TFT panel which is used in a monochromatic active matrix LCD device that is equipped with no color filters.

In short, according to the TFT panel embodying the present invention, even if the forming position of the source electrode SE varies due to an alignment error or misalignment during the manufacturing process, a change in main capacitance and a change in sub capacitance cancel out each other, so that the total gate-source capacitance does not change. The use of the TFT panel of this invention can provide an LCD device which allows the individual pixels to have the same voltage holding characteristic and has an excellent display quality without blurring.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thin film transistor panel comprising:

a substrate;

a plurality of pixel electrodes arranged on said substrate in rows and columns in a matrix form;

a plurality of gate lines provided in association with individual rows of said matrix of said pixel electrodes and each gate line extending in a row direction;

a plurality of data lines provided in association with individual columns of said matrix of said pixel electrodes and each data line extending in a column direction;

a plurality of thin film transistors arranged in association with said pixel electrodes, each thin film transistor having a gate electrode formed integrally at one side of an associated one of said gate lines and protruding therefrom, a gate insulating film covering said gate electrode, a semiconductor film formed, facing said gate electrode, on said gate insulating film, a first electrode connected to said semiconductor film and to said associated pixel electrode, and a second electrode connected to said semiconductor film and to an associated one of said data lines;

each gate line having an extending auxiliary electrode formed for each thin film transistor, and positioned close to the first electrode; and each first electrode having an integrally formed extending part of the respective first electrode, the extending part of each said first electrode being integrally formed as a single, one-piece, continuous member with the respective first electrode and of the same material of the respective first electrode, and the extending part of each said first electrode having an end portion facing and being closely spaced from said auxiliary electrode with an insulating film therebetween.

2. The thin film transistor panel according to claim 1, wherein said first electrode and the extending part of said first electrode are formed in such a manner that a facing area between said extending part and said auxiliary electrode decreases or increases in accordance with an increase or a decrease in a facing area between said first electrode and said associated gate electrode.

3. The thin film transistor panel according to claim 1, wherein said first electrode and the extending part of said first electrode are formed in such a manner that a change in a capacitance of a capacitor between facing portions of said gate electrode and said associated first electrode from a reference value and a change in a capacitance of a capacitor between facing portions of said auxiliary electrode and said extending part of said first electrode from a reference value cancel out each other.

4. The thin film transistor panel according to claim 1, wherein a capacitor between facing portions of said gate electrode and said first electrode and a capacitor between facing portions of said auxiliary electrode and said extending part of said first electrode are connected in parallel between said gate electrode and said first electrode of each thin film transistor.

5. The thin film transistor panel according to claim 1, wherein a sum of an area of facing portions between said gate electrode and said first electrode of each thin film transistor and an area of facing portions between said auxiliary electrode and said extending part of said first electrode is substantially constant for all thin film transistors.

6. The thin film transistor panel according to claim 1, wherein said first electrode and said extending part of said first electrode are comprised of conductive layers formed integrally by a same photolithography process.

7. The thin film transistor panel according to claim 1, wherein:

said first electrode overlaps an edge portion of said associated gate electrode positioned on the side of an associated one of said auxiliary electrodes; and said extending part of said first electrode has an end portion which overlaps an edge portion of said associated auxiliary electrode positioned on the side of said associated gate electrode.

8. The thin film transistor panel according to claim 1, wherein:

said gate line, said gate electrode and said auxiliary electrode are comprised of conductive layers formed by a same photolithography process using divisional exposure; and said first electrode including said integrally formed extending part thereof is comprised of conductive layers formed by a photolithography process using divisional exposure.

9. A thin film transistor panel comprising:

a transparent substrate;

a plurality of pixel electrodes arranged on said transparent substrate in a matrix form;

a plurality of gate lines provided in association with individual rows of said matrix of said pixel electrodes;

a plurality of data lines provided in association with individual columns of said matrix of said pixel electrodes;

a plurality of thin film transistors arranged in association with said pixel electrodes, each thin film transistor having a gate electrode formed at one side of an associated one of said gate lines and protruding therefrom, a gate insulating film covering said gate electrode, a semiconductor film formed, facing said gate electrode, on said gate insulating film, and source and drain electrodes formed on both sides of said semiconductor film along said associated gate line, said source electrode being connected to an associated one of said pixel electrodes;

each gate line having an auxiliary electrode provided in association with a pixel-electrode connecting side of each thin film transistor, arranged along the respective gate line, said auxiliary electrode extending in an extending direction of said gate electrode;

a capacitance compensation electrode formed integrally as one single continuous piece with said source electrode, said capacitance compensation electrode being of the same continuous material as said source electrode, and said capacitance compensation electrode facing a side edge portion of said auxiliary electrode on a thin film transistor side via said insulating film;

a first capacitor formed between said gate electrode and said source electrode, and a second capacitor formed between said auxiliary electrode and said capacitance compensation electrode and having a capacitance which cancels out a variation in a capacitance of said first capacitor, a sum of said capacitance of said first capacitor and said capacitance of said second capacitor being substantially constant regardless of a variation in a fabrication process.

10. A thin film transistor panel comprising:

a substrate;

a plurality of pixel electrodes arranged in a matrix on said substrate such that pixel electrodes in a column direction are arranged in columns in a zigzag manner with regard to pixel electrodes in adjacent columns with a pitch of ½ of a width of said pixel electrodes;

a plurality of gate lines provided in association with individual rows of said matrix of said pixel electrodes and each gate line extending in a row direction;

a plurality of data lines extending in the column direction of said pixel electrodes and said data lines being arranged in said matrix in a zigzag manner so as to correspond to each of the columns of said pixel electrodes;

a plurality of thin film transistors arranged in association with said pixel electrodes, each thin film transistor having a gate electrode formed integrally at one side of an associated one of said gate lines and protruding therefrom, a gate insulating film covering said gate electrode, a semiconductor film formed, facing said gate electrode, on said gate insulating film, a first electrode connected to said semiconductor film and to said associated pixel electrode, and a second electrode connected to said semiconductor film and to an associated one of said data lines, each gate line having an extending auxiliary electrode formed for each thin film transistor, and positioned adjacent to said first electrode; and each first electrode having an extending part of the respective first electrode, the extending part of each said first electrode facing said auxiliary electrode via an insulating film.

11. A thin film transistor panel according to claim 10, wherein each of said data lines, which is bent in said zigzag manner, is connected to a second electrode of each of said thin film transistors, each of which is arranged in a bending direction of said zigzag formed data lines.

12. A thin film transistor panel according to claim 11, wherein said thin film transistors are alternately connected to one side and another side of said data lines which are bent in said zigzag manner.

13. A thin film transistor panel according to claim 10, wherein:

said second electrodes arranged on one side of said thin film transistors are connected to end portions of a bending side of said data lines which are bent in a zigzag manner; and first electrodes arranged on another side of said thin film transistors are connected to said pixel electrodes; and said extending parts of said first electrodes face said auxiliary electrodes so as to hold said insulating films therebetween.

14. A thin film transistor panel according to claim 10, wherein:

said thin film transistors are arranged in each of said rows alternately on one side and another side of said data lines which are bent in said zigzag manner;

said second electrodes of said thin film transistors are connected to said data lines;

said first electrodes of said thin film transistors are connected to said pixel electrodes; and said extending parts of said first electrodes face said auxiliary electrodes so as to hold said insulating films therebetween.

15. A thin film transistor panel according to claim 10, wherein each of said gate lines is arranged to be overlapped on a part of one row of said pixel electrodes, and wherein each row of said pixel electrodes is adjacent to said overlapped gate lines so as to form a compensation capacitor.

* * * * *